(12) United States Patent
Peck

(10) Patent No.: US 8,027,164 B2
(45) Date of Patent: Sep. 27, 2011

(54) MOUNTING ARRANGEMENT FOR FIXING PRINTED CIRCUIT BOARDS DISPOSED ONE ABOVE THE OTHER IN A HOUSING

(75) Inventor: Stefan Peck, Dillingen a. d. Donau (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/521,999

(22) PCT Filed: Jan. 2, 2008

(86) PCT No.: PCT/EP2008/050007
§ 371 (c)(1),
(2), (4) Date: Jul. 2, 2009

(87) PCT Pub. No.: WO2008/083999
PCT Pub. Date: Jul. 17, 2008

(65) Prior Publication Data
US 2009/0316377 A1 Dec. 24, 2009

(30) Foreign Application Priority Data
Jan. 9, 2007 (DE) .......................... 10 2007 001 407

(51) Int. Cl.
*H05K 5/00* (2006.01)
(52) U.S. Cl. .................. 361/730; 361/752; 361/796
(58) Field of Classification Search .............. 361/752, 361/790, 730, 797, 800, 794, 796, 805, 679.01, 361/772, 774, 749, 760, 761; 439/55, 61; 174/16.1, 16.3, 15.1
See application file for complete search history.

(56) References Cited

U.S. PATENT DOCUMENTS

| 3,568,001 | A | | 3/1971 | Straus |
| 4,855,873 | A | | 8/1989 | Bhargava et al. |
| 4,875,140 | A | * | 10/1989 | Delpech et al. ............ 361/789 |
| 4,969,065 | A | * | 11/1990 | Petri ............................. 361/804 |
| 5,018,982 | A | | 5/1991 | Speraw et al. |
| 5,111,362 | A | * | 5/1992 | Flamm et al. ................ 361/736 |
| 5,380,211 | A | | 1/1995 | Kawaguchi et al. |
| 5,424,919 | A | * | 6/1995 | Hielbronner ................ 361/710 |
| 5,500,789 | A | * | 3/1996 | Miller et al. ................ 361/816 |

(Continued)

FOREIGN PATENT DOCUMENTS
DE 2744341 A1 4/1979
(Continued)

OTHER PUBLICATIONS
German Office Action dated Dec. 9, 2008.
(Continued)

*Primary Examiner* — Hung S Bui
(74) *Attorney, Agent, or Firm* — Laurence A. Greenberg; Werner H. Stemer; Ralph E. Locher

(57) ABSTRACT

A mounting configuration for a plurality of printed circuit boards that are arranged one above the other and equipped with electrical components. The printed circuit boards are fixed in a housing assembly formed with a bottom and a top for receiving the printed circuit boards. Engagement holes are positioned congruently in the printed circuit boards, the housing bottom, and the housing top, such that the printed circuit boards, the housing bottom and the housing top can be fixed relative to one another by way of at least one fastener.

12 Claims, 3 Drawing Sheets

U.S. PATENT DOCUMENTS

| | | | |
|---|---|---|---|
| 5,701,233 A * | 12/1997 | Carson et al. | 361/735 |
| 5,986,887 A * | 11/1999 | Smith et al. | 361/704 |
| 6,249,442 B1 * | 6/2001 | Watanabe | 361/801 |
| 6,344,972 B2 * | 2/2002 | Estieule et al. | 361/753 |
| 6,690,582 B2 * | 2/2004 | Sumida | 361/752 |
| 6,955,544 B2 | 10/2005 | Miquel et al. | |
| 2004/0000204 A1 | 1/2004 | Clark | |
| 2004/0100777 A1 * | 5/2004 | Lee | 361/758 |

FOREIGN PATENT DOCUMENTS

| | | |
|---|---|---|
| DE | 10134562 A1 | 2/2003 |
| FR | 2880511 A1 | 7/2006 |

OTHER PUBLICATIONS

International Search Report dated Jun. 10, 2008.

* cited by examiner

MOUNTING ARRANGEMENT FOR FIXING PRINTED CIRCUIT BOARDS DISPOSED ONE ABOVE THE OTHER IN A HOUSING

BACKGROUND OF THE INVENTION

Field of the Invention

The invention relates to a mounting arrangement for a plurality of printed circuit boards disposed one above the other and equipped with electrical components, said printed circuit boards being fixed in a housing arrangement having a housing base and a housing cover to receive the printed circuit boards.

As a result of increasing demands imposed on the functionality of electronic control units in the field of engine management, devices are increasingly being designed with a number of printed circuit boards. In such cases conflicting requirements are increasingly arising as regards the mechanical design. On the one hand the electronics must be cooled effectively, meaning that only narrow and not very variable gaps are able to be considered for a thermal exchange layer. On the other hand the printed circuit boards should not be deformed mechanically, in order to avoid reliability problems resulting from broken components or connections between components and printed circuit boards. Uniform gaps for a thermal exchange layer can be realized by screwing the individual printed circuit boards onto the heat sink in a defined manner. However this means that a relatively large amount of space on the printed circuit boards is used for the securing elements. There are also layout-related restrictions to be considered because of the numerous large through holes in the printed circuit boards. If the number of connecting elements is reduced, it is necessary to secure more than one printed circuit board with one connecting element. Different tolerance chains then result in differing gaps and thus also a differing thermal efficiency.

A system for the electrical contacting and mechanical securing of printed circuit boards is known from DE 101 34 562 A1, which features at least one cutting element or cutting and clamping element to be positioned on the underside of a printed circuit board and a securing element on the printed circuit board. In order to ensure simple and fast assembly or disassembly, a support is fixed with regard to at least one conducting wire in such a manner that when the printed circuit board is mechanically secured with the support by means of the securing element on the printed circuit board, the conducting wire can be directly contacted by the cutting element or cutting and clamping element on the underside of the printed circuit board.

One disadvantage of the prior art is that securely mounted printed circuit boards are deformed when subject to the action of heat, which can damage the electrical components on the printed circuit board or the electrical contacting. The fact that the printed circuit boards are not supported in a stress-free manner when subject to the action of heat also means that it is not possible to guarantee a thermally optimized construction with defined thermal exchange layers. Added to this is the fact that the assembly space on the circuit board is significantly restricted by the screw fixings.

BRIEF SUMMARY OF THE INVENTION

Using this as its starting point, the object of the present invention is to create a mounting arrangement for a plurality of printed circuit boards disposed one above the other and equipped with electrical components in a housing arrangement, which makes it possible for the printed circuit boards to be supported in a stress-free manner but in the process forms defined thermal transition regions and requires little assembly space on the circuit board.

This object is achieved by a mounting arrangement with the features of claim 1. Advantageous embodiments and developments, which can be used individually or in combination, are the subject matter of the dependent claims.

The inventive mounting arrangement for a plurality of printed circuit boards disposed one above the other and equipped with electrical components in a housing arrangement is characterized in that that engagement holes are disposed in congruent positions in the printed circuit boards, the housing base and the housing cover, so that the printed circuit boards, the housing base and the housing cover can be fixed securely to and in relation to one another by way of at least one securing means. According to the invention provision is made for the printed circuit boards, which are connected electrically and mechanically for example by a press-in sleeve or preferably a spacer sleeve, to be inserted onto a cooling surface provided in the housing cover. The housing base, which likewise has a cooling surface, is then positioned on the upper of the two printed circuit boards. A securing means, for example in the form of a screw or plug-in element, is then introduced by way of an opening in the housing base and fixed to the housing cover through the upper printed circuit board, the press-in sleeve and the lower printed circuit board.

In a further embodiment provision is made for a printed circuit board with a threaded element molded onto it to be secured to the housing base by way of a threaded bolt and a second printed circuit board with a threaded element molded onto it to be secured to the housing cover. This embodiment also allows continuous dissipation of the power loss by way of both housing parts. More surface area is also available here on the printed circuit board for the positioning of the electrical components.

By connecting the upper printed circuit board to the housing base and by connecting the lower printed circuit board to the housing cover it is possible to avoid a stepped arrangement of the boards and both printed circuit boards can therefore be embodied with approximately equal size. There is thus more board surface area available for the positioning of electrical components. The direct fixing of the press-in sleeve, which can be configured in the form of a threaded element, to a board means that there is no need for a connecting frame for the sleeves. This creates further space on the board for the positioning of the electrical components. It is also possible to dissipate the power loss by way of both housing parts, with the result that the boards and therefore the components and solder points are cooled more efficiently. This requires sufficient pressure to be applied to the boards, thereby ensuring optimal thermal connection.

The height tolerances of the cooling surfaces, the boards and the threaded element are compensated for by way of a seal. One further major advantage is that the securing means can have two functions. On the one hand the securing means can seal the housing and on the other hand it can fix the boards in the interior of the housing. The functionality of the complete electrical system can be tested before it is mounted in the housing. As a result it is possible to carry out repairs or eliminate errors more simply during manufacture.

The inventive embodiments have the further advantage that position-dependency is reduced in that it is possible to access the threaded bolt directly using the screw tool. It is also advantageous that no screw feed is required. This solution means that the board is no longer deformed during the fixing process, as the normal force of the screw tool is applied directly to the threaded bolt. This prevents the fracturing of solder points or electrical components. The connection of the upper printed circuit board to the housing base and the connection of the lower printed circuit board to the housing cover means that a stepped arrangement of the printed circuit boards is not required and both printed circuit boards can therefore be embodied with approximately equal size.

Further advantages and embodiments of the invention are described in more detail below with reference to exemplary embodiments and the schematic drawing, in which:

DESCRIPTION OF THE INVENTION

Figure 1:
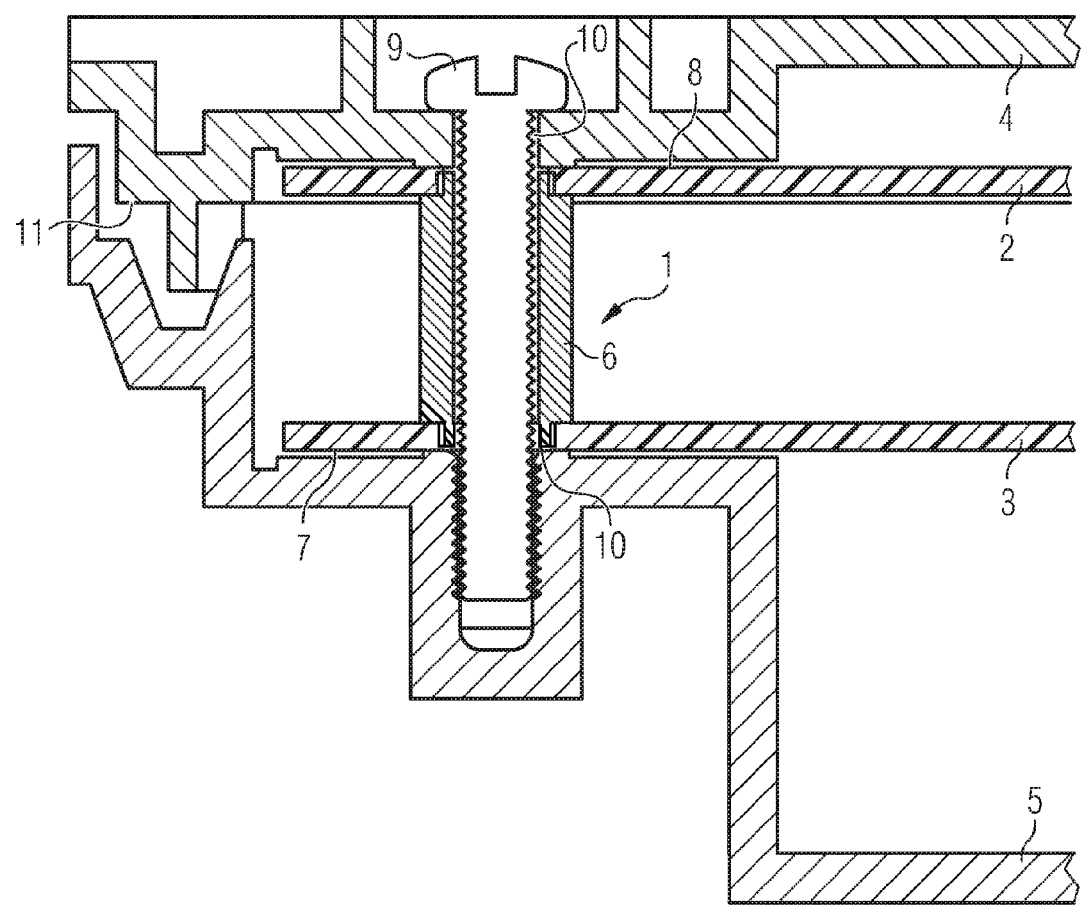
FIG. 1 shows a sectional diagram of a first exemplary embodiment of an inventive mounting arrangement for fixing printed circuit boards disposed one above the other in a housing.

FIG. 1 shows a sectional diagram of a first exemplary embodiment of an inventive mounting arrangement 1 for fixing printed circuit boards 2, 3 disposed on above the other in an electronics housing that is preferably configured in two parts with a housing base 4 and a housing cover 5. A press-in sleeve, preferably in the form of a spacer sleeve 6, is disposed between the printed circuit boards 2, 3. According to the invention provision is made for the printed circuit boards 2, 3, which are connected electrically and by the spacer sleeve 6 mechanically, to be inserted onto a cooling surface 7 disposed in the housing cover 5. The housing base 4 with a cooling surface 8 is then positioned on the printed circuit board 2. A securing means 9, preferably a screw or plug-in element, is then introduced through a congruently disposed engagement hole 10 in the housing base 4, in the printed circuit boards 2, 3 and in the housing cover 5 and these components are fixed to and in relation to one another. To compensate for the height tolerances of the cooling surfaces 7, 8, the printed circuit boards 2, 3 and the spacer sleeve 6 a seal is disposed 11 in these regions.

Figure 2:
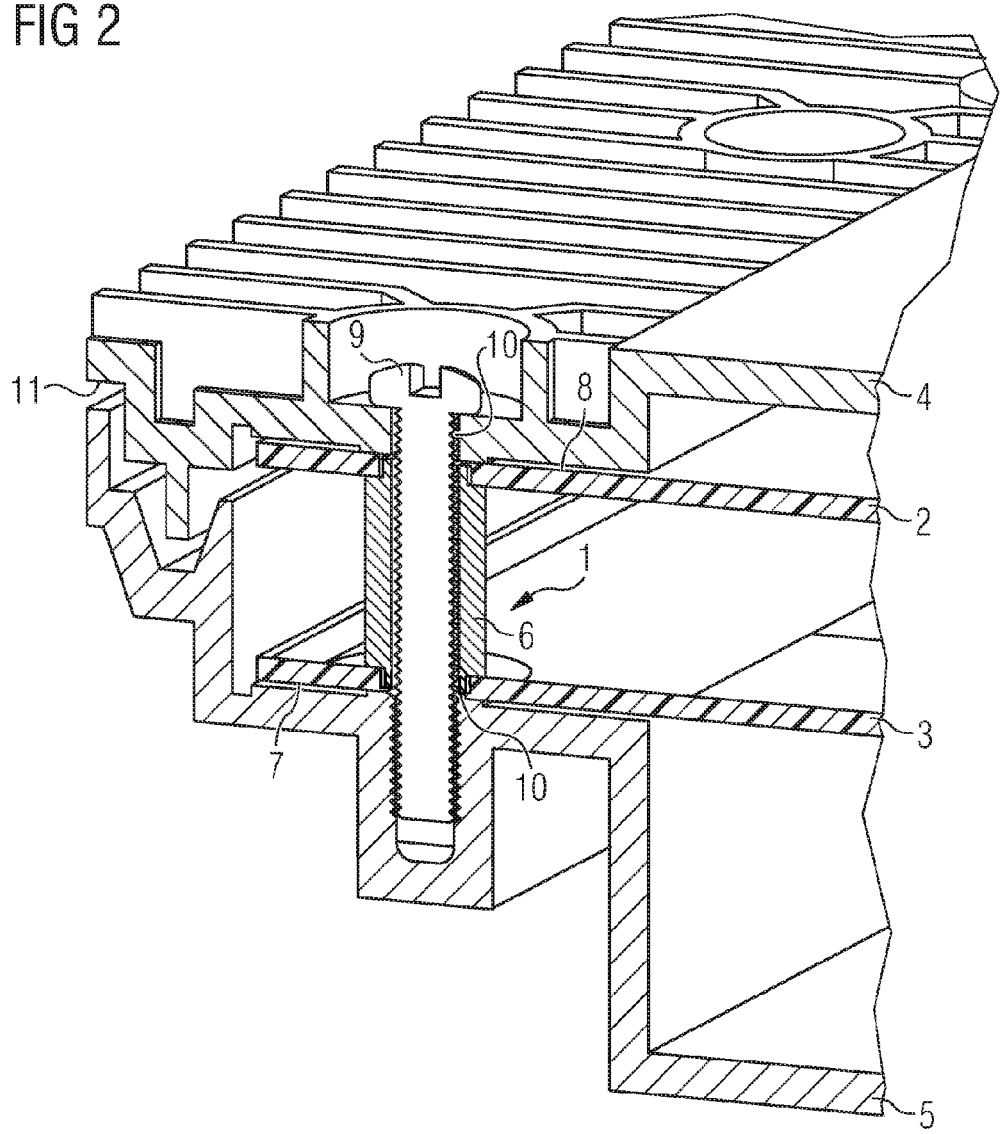
FIG. 2 shows a perspective diagram of the exemplary embodiment of the inventive mounting arrangement according to FIG. 1.

FIG. 2 shows a perspective diagram of the exemplary embodiment of the inventive mounting arrangement according to FIG. 1.

Figure 3:
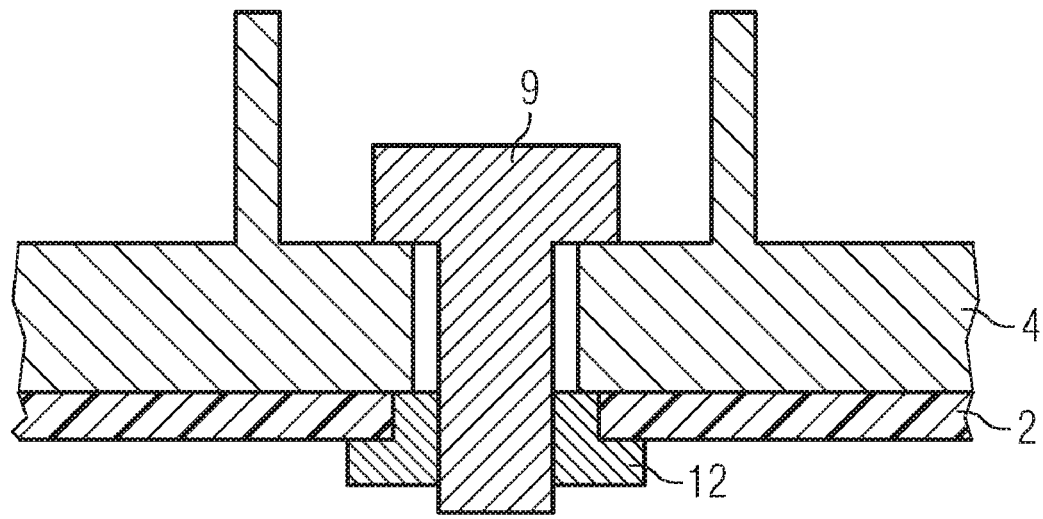
FIG. 3 shows a sectional diagram of a second exemplary embodiment of the inventive mounting arrangement for fixing printed circuit boards disposed one above the other in a housing.
Figure 3:
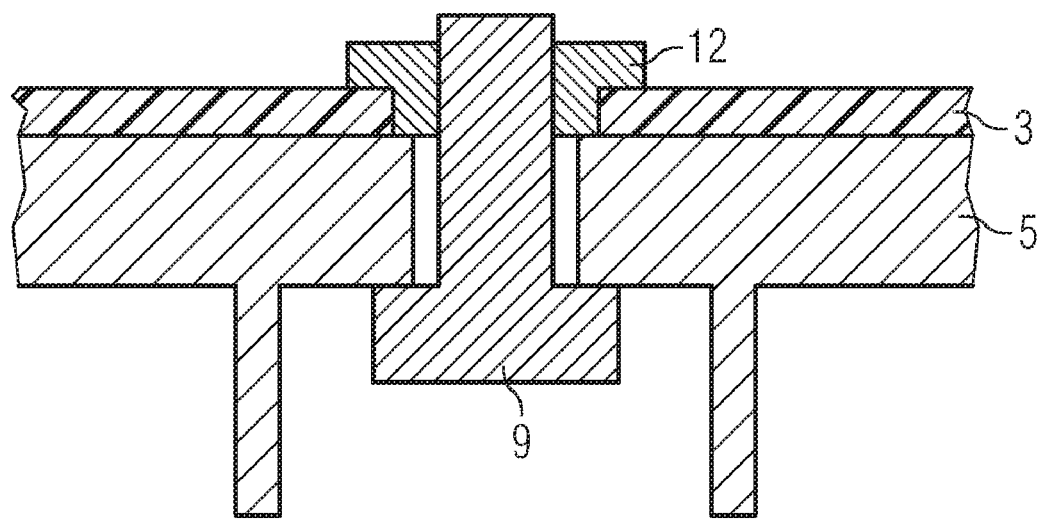

FIG. 3 shows a sectional diagram of a second exemplary embodiment of the inventive mounting arrangement for fixing printed circuit boards disposed one above the other in a housing. In this preferred embodiment provision is made for the printed circuit board 2 with a threaded element 12 molded onto the upper side, in other words onto the side to be equipped with electrical components, to be secured to the housing base 4 by way of a securing means 9 and the printed circuit board 3 to be secured to the housing cover 5 by way of a threaded element 12 disposed on the lower side and a further securing means 9. The securing means 9 are each inserted from the outside through a congruently disposed engagement hole 10 in the printed circuit board 2 and in the housing base 4 and/or in the printed circuit board 3 and in the housing cover 5 and emerge respectively into the threaded elements 12.

The invention claimed is:

1. A mounting configuration, comprising:
   a housing assembly formed with a housing base and a housing cover;
   a plurality of printed circuit boards equipped with electrical components and disposed one above the other in said housing assembly;
   at least one spacer mechanically connecting said plurality of printed circuit boards together; and
   a seal;
   said housing base including a first cooling surface and said housing cover including a second cooling surface;
   said plurality of printed circuit boards placed on said first cooling surface and said second cooling surface;
   said seal compensating for height tolerances of said cooling surfaces, said plurality of printed circuit boards, and said spacer; and
   said printed circuit boards, said housing base, and said housing cover being formed with engagement holes in mutually congruent positions, enabling at least one fastening device to securely fix said printed circuit boards in said housing assembly and to commonly fix said printed circuit boards, said housing base, and said housing cover securely in relation to one another.

2. The mounting configuration according to claim 1, which comprises a spacer sleeve disposed between said printed circuit boards.

3. The mounting configuration according to claim 1, which comprises threaded elements disposed on said printed circuit boards, for meshing with said fasting device.

4. The mounting configuration according to claim 1, wherein said printed circuit boards have a common format.

5. The mounting configuration according to claim 1, wherein said fasting device is a screw fastener.

6. The mounting configuration according to claim 1, wherein said fasting device is a plug-in element.

7. The mounting configuration according to claim 1, wherein said spacer electrically connects said plurality of printed circuit boards together.

8. The mounting configuration according to claim 1, wherein said spacer is a press-in sleeve.

9. The mounting configuration according to claim 1, wherein said spacer is a spacer sleeve.

10. The mounting configuration according to claim 1, wherein said spacer mechanically connects said plurality of printed circuit boards together independently from said fastening device.

11. The mounting configuration according to claim 1, wherein one of said plurality of printed circuit boards is placed on said first cooling surface and another one of said plurality of printed circuit boards is placed on said second cooling surface.

12. The mounting configuration according to claim 1, wherein said seal is disposed between said housing base and said housing cover.

* * * * *